(12) United States Patent
Lanio et al.

(10) Patent No.: US 9,666,406 B1
(45) Date of Patent: May 30, 2017

(54) CHARGED PARTICLE BEAM DEVICE, SYSTEM FOR A CHARGED PARTICLE BEAM DEVICE, AND METHOD FOR OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventors: Stefan Lanio, Erding (DE); Matthias Firnkes, Walpertskirchen (DE); Benjamin John Cook, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/047,007

(22) Filed: Feb. 18, 2016

(51) Int. Cl.
*H01J 37/147* (2006.01)
*H01J 37/20* (2006.01)

(52) U.S. Cl.
CPC ........ *H01J 37/1475* (2013.01); *H01J 37/20* (2013.01); *H01J 2237/152* (2013.01)

(58) Field of Classification Search
USPC ....................... 250/492.3, 396 ML
See application file for complete search history.

(56) References Cited

U.S. PATENT DOCUMENTS

2007/0215812 A1* 9/2007 Doering ............... B82Y 10/00
250/396 ML

* cited by examiner

*Primary Examiner* — Kiet T Nguyen
(74) *Attorney, Agent, or Firm* — Kilpatrick Townsend & Stockton LLP (57) ABSTRACT

The present disclosure provides a charged particle beam device. The charged particle beam device includes an emitter arrangement configured to generate a primary charged particle beam having two or more primary charged particle sub-beams, a sample stage for supporting a sample, an objective lens for focusing the two or more primary charged particle sub-beams onto the sample, and a primary charged particle optics. The primary charged particle optics includes a coil provided between the emitter arrangement and the objective lens. The coil is configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1. A controller is configured to adjust the magnetic field of the coil such that a first primary charged particle sub-beam of the two or more primary charged particle sub-beams is directed towards a first spot on the sample and a second primary charged particle sub-beam of the two or more primary charged particle sub-beams is directed towards a second spot on the sample, wherein the first spot and the second spot are spaced apart from each other.

15 Claims, 6 Drawing Sheets

CHARGED PARTICLE BEAM DEVICE, SYSTEM FOR A CHARGED PARTICLE BEAM DEVICE, AND METHOD FOR OPERATING A CHARGED PARTICLE BEAM DEVICE

FIELD

Embodiments of the present disclosure relate to a charged particle beam device, a system for a charged particle beam device, and a method for operating a charged particle beam device. Embodiments of the present disclosure particularly relate to charged particle beam devices for multi-beam guidance within a column of the charged particle beam device.

BACKGROUND

Charged particle beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to their short wavelengths.

High throughput electron beam inspection (EBI) systems can utilize multi-beam charged particle beam devices, such as electron microscopes, that are able to create, focus and scan multiple primary charged particle beams inside a single column of the charged particle beam device. A sample can be scanned by an array of focused primary charged particle beams, which in turn create multiple signal charged particle beams. The individual signal charged particle beams are mapped onto detection elements.

A rotational position of the array of primary charged particle beams can be influenced by operating parameters of the charged particle beam device. Accordingly, a rotational position of the array of primary charged particle beams can change, for example, when an image mode of the charged particle beam device is changed. The individual primary charged particle beams cannot reliably be mapped onto predetermined spots on the sample.

In view of the above, charged particle beam devices, systems, and methods that overcome at least some of the problems in the art are beneficial. In particular, charged particle beam devices, systems, and methods that can reliably map individual primary charged particle beams onto predetermined spots on a sample, even when operating parameters of the charged particle beam device are changed, are beneficial.

SUMMARY

In light of the above, a charged particle beam device, a system for a charged particle beam device, and a method for operating a charged particle beam device are provided. Further aspects, benefits, and features of the present disclosure are apparent from the claims, the description, and the accompanying drawings.

According to an aspect of the present disclosure, a charged particle beam device is provided. The charged particle beam device includes an emitter arrangement configured to generate a primary charged particle beam having two or more primary charged particle sub-beams, a sample stage for supporting a sample, an objective lens for focusing the two or more primary charged particle sub-beams onto the sample, and a primary charged particle optics. The primary charged particle optics includes a coil provided between the emitter arrangement and the objective lens, wherein the coil is configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1, and a controller configured to adjust the magnetic field of the coil such that a first primary charged particle sub-beam of the two or more primary charged particle sub-beams is directed towards a first spot on the sample and a second primary charged particle sub-beam of the two or more primary charged particle sub-beams is directed towards a second spot on the sample, wherein the first spot and the second spot are spaced apart from each other.

According to another aspect of the present disclosure, a system for a charged particle beam device is provided. The system includes an emitter arrangement configured to generate a primary charged particle beam having two or more primary charged particle sub-beams, a coil configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1, and a controller configured to adjust the magnetic field of the coil to rotate the two or more primary charged particle sub-beams with respect to the longitudinal axis.

According to further aspects having further optional features, coil and the controller can be configured as defined for charged particle beam devices in any of the embodiments described herein.

According to yet another aspect of the present disclosure, a method for operating a charged particle beam device is provided. The method includes the generation of a primary charged particle beam having two or more primary charged particle sub-beams, a guiding of the two or more primary charged particle sub-beams through a coil having an aspect ratio of at least 1, and a rotating of the two or more primary charged particle sub-beams with respect to a longitudinal axis of the coil using a magnetic field of the coil.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography, chemical constituents and/or electrostatic potential of the sample and others. The secondary electrons can include at least one of backscattered electrons and Auger electrons. The signal charged particles can be collected and guided to a detector, sensor, e.g., a scintillator, a pin diode or the like.

High throughput electron beam inspection (EBI) systems can utilize multi-beam charged particle beam devices, such as electron microscopes, that are able to create, focus and scan multiple primary charged particle beams ("primary charged particle sub-beams") inside a single column of the charged particle beam device. A sample can be scanned by an array of focused primary charged particle sub-beams, which in turn create multiple signal charged particle beams ("signal charged particle sub-beams"). EBI systems can use a compound electrostatic-magnetic objective lens, which collects and accelerates the multiple signal charged particle beams back into the column to be separated from the multiple primary charged particle beams by a deflection device, such as a Wien Filter.

In a scanning scheme of the array of focused primary charged particle sub-beams, a precise alignment of the rotation of the array, e.g., with respect to a travel direction of the sample stage providing one of two orthogonal scanning dimensions, is beneficial. Due to a magnetic field of the objective lens, a rotation angle of the array at the sample position, e.g., with respect to a central, axial sub-beam, can vary. This variation originates from the Larmor rotation of the sub-beams, such as the electron beams, caused by the magnetic field of the objective lens. An amount of Larmor rotation can depend on an image mode of the EBI system.

The present disclosure can compensate the Larmor rotation, for example, caused by the objective lens, of the array of primary charged particle sub-beams. The embodiments described herein use primary charged particle optics rather than mechanical rotation or a skewed travel of the sample stage. Rotation correction is particularly achieved by a coil, such as a long solenoid coil, having a high aspect ratio (i.e., the coil is longer than a radius). The coil can be inserted into a drift space between an emitter arrangement defining the multi-beam array and the objective lens. By implementing the coil e.g. in the drift space, a defined amount of Larmor rotation can be introduced, wherein the original focusing properties of the primary charged particle sub-beams remain substantially unchanged. In particular, the coil leads to a marginal additional focusing action, specifically when the rotation angles are small, e.g. below +/−30°, which does substantially not deteriorate the original optical properties at zero coil excitation.

Figure 1:
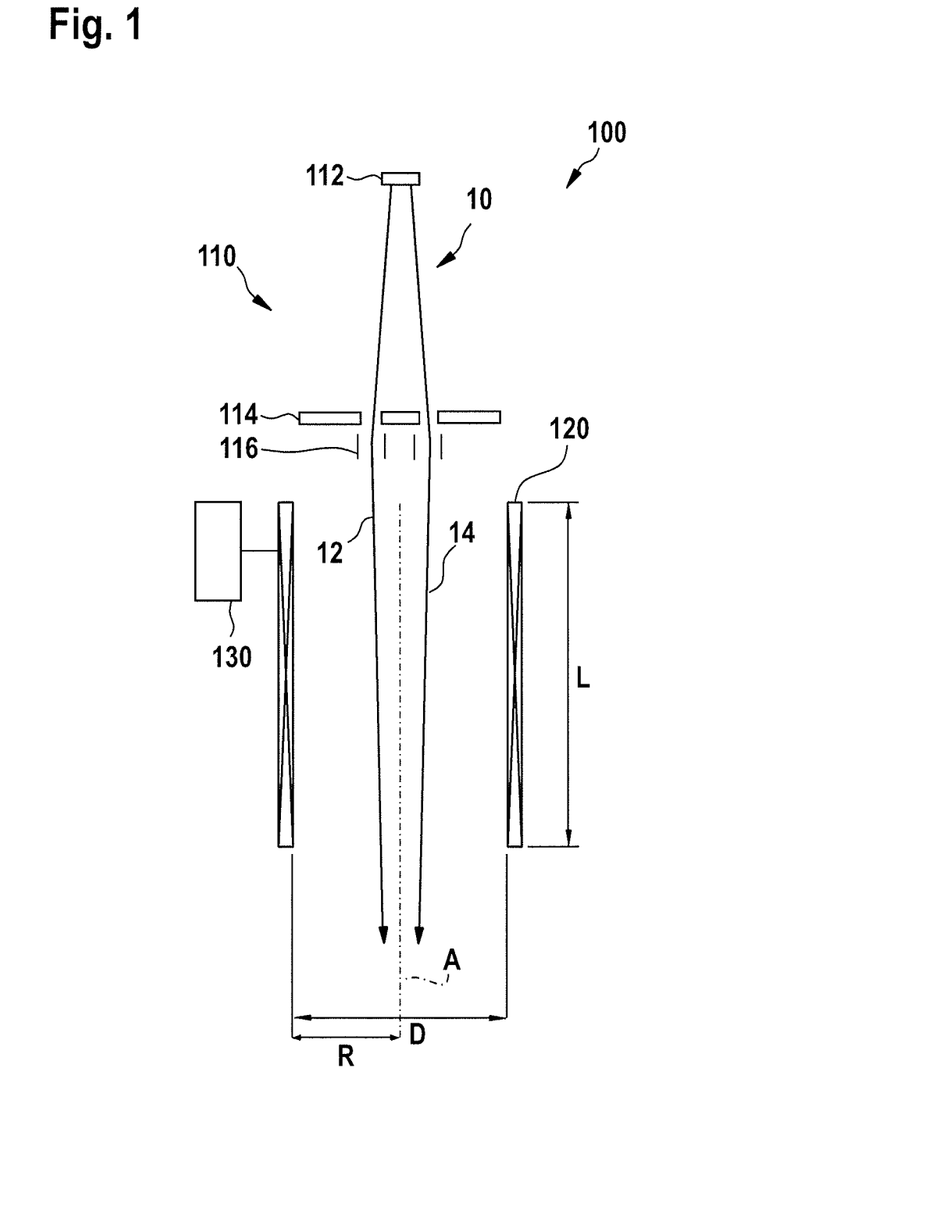
FIG. 1 shows a schematic view of the system for a charged particle beam device according to embodiments described herein.

FIG. 1 shows a schematic view of a system 100 for a charged particle beam device according to embodiments described herein. A "sample" as referred to herein, includes, but is not limited to, semiconductor wafers, semiconductor workpieces, and other workpieces such as memory disks and the like. Embodiments of the disclosure may be applied to any workpiece on which material is deposited or any workpiece which is structured.

The system 100 includes an emitter arrangement 110 configured to generate a primary charged particle beam 10 having two or more primary charged particle sub-beams, such as a first primary charged particle sub-beam 12 and a second primary charged particle sub-beam 14. The system 100 includes a coil 120 configured to generate a magnetic field having a magnetic field component parallel to a longitudinal axis A of the coil 120. The magnetic field, for example, the magnetic field component parallel to the longitudinal axis A, acts on the two or more primary charged particle sub-beams propagating along the longitudinal axis A. The system 100 further includes a controller 130 configured to adjust the magnetic field of the coil 120 to rotate the two or more primary charged particle sub-beams with respect to the longitudinal axis A. An aspect ratio of the coil 120 is at least 1.

As used throughout the present disclosure, the primary charged particle beam impinging on the sample consists of multiple primary charged particle sub-beams, which may be separated or spaced apart from each other. Likewise, the signal charged particle beam emanating from the sample upon impingement of the primary charged particle on the sample consists of multiple signal charged particle sub-beams, which may be separated or spaced apart from each other.

According to some embodiments, which can be combined with other embodiments described herein, the emitter arrangement 110 includes a primary charged particle emitter 112 configured to generate the primary charged particle beam 10, one or more apertures 114 (e.g., beam limiting apertures) configured to generate the two or more primary charged particle sub-beams from the primary charged particle beam 10, and a sub-beam deflector arrangement 116 configured to deflect the two or more primary charged particle sub-beams. An example of an emitter arrangement 110 is further explained with respect to FIGS. 5A and B.

In particular, the generation of an array of many electron beams from a single emitter inside a single electron microscope column can use an electron emitter (e.g., the primary charged particle emitter 112), a condenser lens system to converge the emitted electron bundle onto an array of beam limiting apertures (e.g., the one or more apertures 114; the aperture array creates the multiple beamlets, which are still originating from the same virtual source), an array of deflection systems (e.g., the sub-beam deflector arrangement 116) below the array of apertures which deflects the individual beams back towards the optical axis (this creates an array of virtual sources), and an objective lens system that images the array of virtual sources onto the sample plane.

For a given column and fixed operating conditions of (i) beam energy inside the column, (ii) working distance, (iii) landing energy LE, and (iv) extraction field G, there can be only one optimized setting for the column parameters (e.g., lens excitations, beam axis alignment, and the like) which gives the best optical performance. The optimized setting can come with a certain amount of Larmor rotation 9 caused by the axial magnetic field of the objective lens system. Accordingly, the azimuthal orientation of the focused beams on the sample is rotated with respect to the azimuthal orientation of the aperture array by the angle θ. This angle can depend on the Image Mode (IM) of the charged particle beam device, such as an electron microscope. Since a fixed relative rotation between the scanning spot pattern and a stage travel direction (which can be aligned to the sample (chip) layout coordinate system) is beneficial in multi-beam scanning, the present disclosure provides an electron optical component, namely the coil 120, that can correct for the changes of the Larmor rotation with the IM.

According to some embodiments, which can be combined with other embodiments described herein, the coil 120 can be a solenoid coil. The magnetic field, e.g., the magnetic field component parallel to the longitudinal axis A, acts on the two or more primary charged particle sub-beams, such as the first primary charged particle sub-beam 12 and the second primary charged particle sub-beam 14, propagating along the longitudinal axis A of the coil 120. The longitudinal axis A can correspond to, or be, an optical axis of the charged particle beam device. In particular, the longitudinal axis A can be a section of an optical axis of the system 100. Although FIG. 1 illustrates a primary charged particle beam 10 having two signal charged particle sub-beams, it is to be understood that the present disclosure is not limited thereto and that any number of primary charged particle sub-beams can be provided. In particular, the number of primary charged particle sub-beams can correspond to a number of spots on the sample or a number of signal charged particle sub-beams emanating from the sample.

Figure 3A:
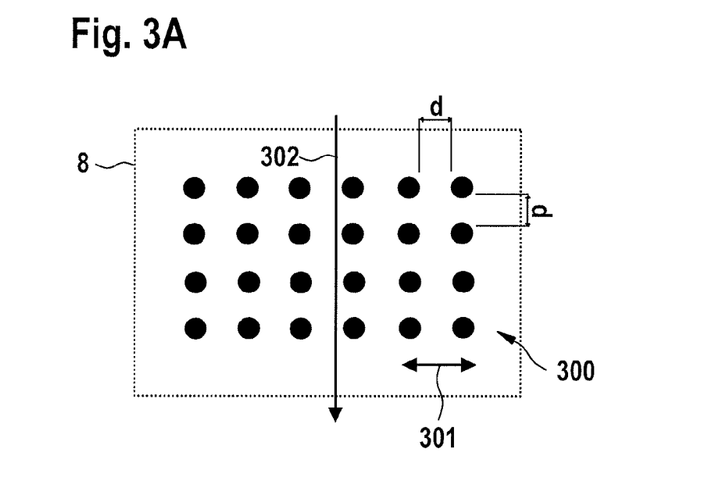
FIGS. 3A and B show a rotation of an array of primary charged particle sub-beams on a sample plane according to embodiments described herein.
Figure 3B:
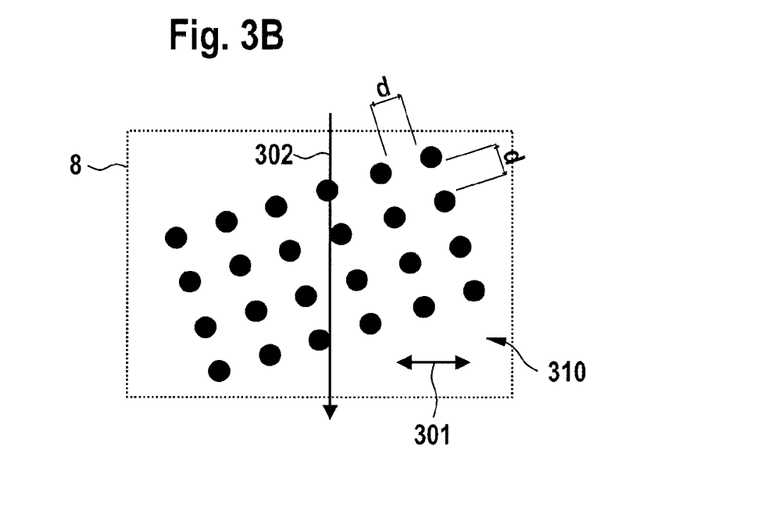

According to some embodiments, the controller 130 can be configured to control a current flowing through the coil 120 in order to adjust the magnetic field generated by the current. The coil 120 is configured as a rotation correction device for correction of a rotation of the two or more primary charged particle sub-beams, such as the first primary charged particle sub-beam 12 and the second primary charged particle sub-beam 14. In particular, the coil 120 is configured as a rotation correction device for correction of a rotation of the two or more primary charged particle sub-beams for directing the two or more primary charged particle sub-beams onto respective predetermined spots on a sample. This is further explained with respect to FIGS. 3A and B.

An aspect ratio (e.g., L/R and/or L'/R' as described below) of the coil 120 is at least 1, specifically at least 3, more specifically at least 5. In some implementations, the aspect ratio is in a range between 1 and 10, e.g., between 1 and 5 or between κ and 10. The coil 120 having the high aspect ratio can introduce a predetermined amount of Larmor rotation in the primary charged particle sub-beams. The original focusing properties of the primary charged particle sub-beams can remain substantially unchanged.

The coil 120 has a length L along the longitudinal axis A and a radius R perpendicular to the longitudinal axis A. A diameter D of the coil 120 can be twice the radius R. The radius R can be an inner radius of the coil 120, such as a radius of an empty propagation space within the coil 120 that is configured for propagation of the primary charged particle beam 10. In some implementations, the coil 120 is a cylindrical coil. The radius R can be a (inner) radius of the cylinder, and the length L can be a length of the cylinder. The propagation space within the coil 120 can correspond to a cylinder volume of the cylindrical coil. The aspect ratio can be defined as the ratio of the length L and the radius R (L/R). According to some embodiments, the length L is at least 5 cm, specifically at least 10 cm, and more specifically at least 15 cm.

The coil 120 generates the magnetic field within the coil 120, and in particular within the propagation space that is configured for propagation of the primary charged particle beam 10. The magnetic field has a magnetic field component parallel to the longitudinal axis A of the coil 120 and a (much smaller) magnetic field component perpendicular to the longitudinal axis A of the coil 120, specifically at the entrance part and/or exit part of the coil 120. The magnetic field, e.g., the magnetic field component parallel to the longitudinal axis A, acts on the vector components of the charged particle velocity perpendicular to the longitudinal axis A, causing the Larmor rotation of the primary charged particles of the primary charged particle sub-beams with respect to the longitudinal axis A. In other words, the primary charged particles move along a spiral pathway through the coil 120.

According to some embodiments, which can be combined with other embodiments described herein, the coil 120 provides a magnetic field region providing the magnetic field that acts on the signal charged particle sub-beams to cause the Larmor rotation. The magnetic field region has a length L' along the longitudinal axis A and a radius R' perpendicular to the longitudinal axis A. According to some embodiments, the radius R' can correspond to, or be, the radius R of the coil 120, and/or the length L' can correspond to, or be, the length L of the coil 120. The aspect ratio of the coil 120 can be defined as the ratio of the length L' and the radius R' (L'/R') of the magnetic field region. According to some embodiments, the length L' is at least 5 cm, specifically at least 10 cm, and more specifically at least 15 cm.

To compensate for a rotation of the primary charged particle sub-beams e.g. introduced by the objective lens excitation, and/or to keep a position of the primary charged particle sub-beams on the sample plane essentially constant, the coil 120 for rotation correction has a high aspect ratio. In more detail, the magnetic field at the center of the coil 120 having N turns can be approximately expressed by $$B = \frac{\mu_0 NI}{\sqrt{4R^2 + L^2}}$$

where $\mu_0$ is the vacuum permeability, NI the coil excitation (Amp-turns), and R and L radius and length of the coil 120. The rotation of the primary charged particles, such as an electron, after travelling through the magnetic field of the coil 120 can be approximated by $$\theta = \frac{eBL}{2mv}$$

with e the electron charge, m the electron mass and v the velocity of the electron (non-relativistic).

The focal length of the coil 120 can be approximated by $$f = \frac{8mV}{eLB^2}$$

with V being the electron potential.

Considering the proportionality between θ and L/R for a fixed NI, the rotation increases strongly for aspect ratios between 1 and 5, while for ratios above 5, the rotation angle settles towards a limit defined by NI. With respect to the rotation angle and the focal length, while the rotation angle increases linearly with NI, the focal length decreases with $1/(NI)^2$. As an example, to correct a rotation angle of ±10°, about 160 AT coil excitation can be used. This leads to a focal length of about 3000 mm, which is much larger than the focal length of objective lens (e.g., tens of mm). An impact of the coil 120 on the focusing of the primary charged particle sub-beams is minimal. According to some embodiments, the load of the coil 120 on the focusing properties can be compensated by the objective lens.

Figure 2:
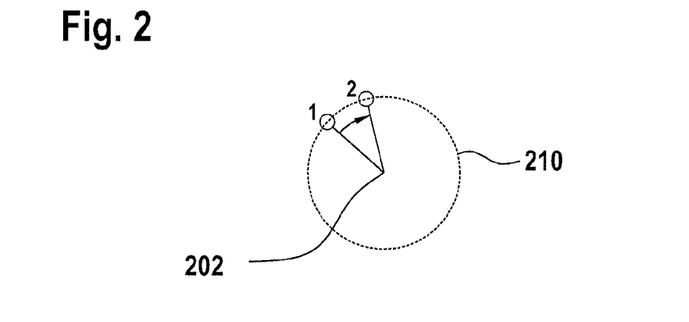
FIG. 2 shows a rotation of a primary charged particle sub-beam on a sample plane according to embodiments described herein.

FIG. 2 shows a rotation of a primary charged particle sub-beam on a sample plane according to embodiments described herein. FIGS. 3A and B show a rotation of an array of primary charged particle sub-beams on the sample or sample plane according to embodiments described herein.

The rotational position of the primary charged particle sub-beams (the primary charged particle spot pattern) is not a fixed value, but can depend on operating parameters of the charged particle beam device, for example, used in an image mode (IM). The image mode can be defined by the operating parameters of the charged particle beam device, such as an electron microscope. The operating parameters may include at least one of an electron landing energy LE (keV) on the sample, an extraction field G (V/mm), a beam energy BE (keV) inside the column, and a working distance WD (mm).

While beam energy BE and working distance WD can be kept fixed, the landing energy LE and the extraction field G are frequently readjusted to get the best imaging performance from a given sample. These changes, which may influence the refractive power of an objective lens of the charged particle beam device, can impact the primary charged particle beam, e.g., the multiplicity of the sub-beams forming the array. In particular, the field changes can lead to a change of Larmor rotation of the primary charged particle spot pattern in the sample plane.

According to some embodiments, which can be combined with other embodiments described herein, the coil is configured to rotate the two or more primary charged particle sub-beams, such as the first primary charged particle sub-beam and the second primary charged particle sub-beam with respect to, or around, an axis 202 in a plane perpendicular to the longitudinal axis of the coil. The axis 202 can be parallel to, or correspond to, the longitudinal axis of the coil. As illustrated in FIG. 2, a primary charged particle sub-beam is rotated by the magnetic field generated by the coil from a first position 1 to a second position 2. The rotation is a rotation around the axis 202, which can be the longitudinal axis. In the plane perpendicular to the longitudinal axis A, the rotation may correspond to a movement of the primary charged particle sub-beam on a circular path 210.

In some implementations, the coil is configured to rotate the two or more primary charged particle sub-beams, such as the first primary charged particle sub-beam and the second primary charged particle sub-beam by an angle in a range between +30° and −30°, specifically by an angle in a range between +10° and −10°, and more specifically by an angle in a range between +5° and −5°. The positive angle values can indicate a clockwise rotation when seen from the sample side. The negative angle values can indicate a counter-clockwise rotation when seen from the sample side.

Turning now to FIGS. 3A and B, the sample plane can be provided by a surface of the sample 8 that is to be scanned by the array of primary charged particle sub-beams. The individual primary charged particle sub-beams are directed onto respective separated spots on the sample 8. The number of spots corresponds to the number of primary charged particle sub-beams.

According to some embodiments, which can be combined with other embodiments described herein, the distance or spacing d between adjacent spots, e.g., centers thereof can be at least 1 μm, specifically at least 10 μm, and more specifically at least 50 μm. In some implementations, the distance or spacing d is about 50 μm.

In some implementations, the array of primary charged particle sub-beams can scan the sample (also referred to as "wafer") in one direction, while the sample stage is travelling in the orthogonal direction, thus providing a second dimension of the scan. The array is rotated with respect to the stage travel direction such that each sub-beam or ("beamlet") covers an individual narrow stripe on the sample, with a small overlap area at the edge of the stripes for image stitching. The array can provide 100% coverage of the scanned area.

As an example, a scanning scheme of the primary charged particle sub-beams uses a first scan direction 301 and a second scan direction 302 different from the first scan direction 301. As an example, the first scan direction 301 and the second scan direction 302 can be substantially perpendicular to each other. The first scan direction 301 can be provided by a deflector arrangement configured to deflect the primary charged particle sub-beams in the first scan direction 301. The second scan direction 302 can be provided by the sample stage configured to move the sample 8 in the second scan direction 302.

In FIG. 3A, the array 300 of primary charged particle sub-beams is shown without rotation with respect to the second scan direction 302 on the sample plane. In FIG. 3B, the array 310 of primary charged particle sub-beams is shown with a rotation generated using the coil of the present disclosure. The array 310 of primary charged particle sub-beams, and particularly each of the primary charged particle sub-beams, is rotated by a defined angle such that the array 310 is aligned with respect to sample 8 or sample plane. In particular, the array 310 of primary charged particle sub-beams can be rotated with respect to the second scan direction 302 provided by the sample stage such that each sub-beam covers an individual narrow stripe on the sample as mentioned above.

Figure 4:
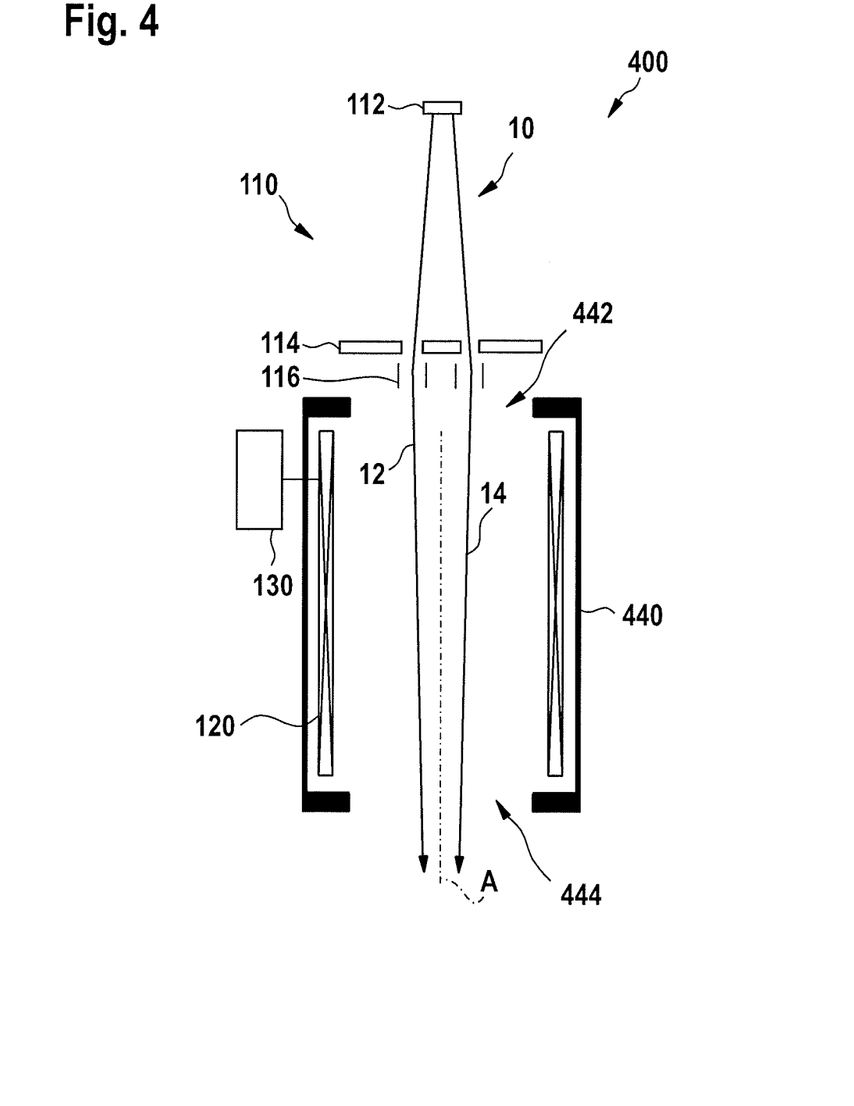
FIG. 4 shows a schematic view of the system for a charged particle beam device according to further embodiments described herein.

FIG. 4 shows a schematic view of the system 400 for a charged particle beam device according to further embodiments described herein. The system 400 can be provided within a vacuum housing.

According to some embodiments, which can be combined with other embodiments described herein, the system 400 includes a magnetic shielding device 440 at least partially enclosing or cladding the coil 120. The magnetic shielding device 440 can also be referred to as "magnetic shroud". The magnetic shielding device 440 can be made from a soft-magnetic material, such as Mu-metal or permalloy. The magnetic shielding device 440 can reduce or even prevent a leakage of magnetic field lines from the coil 120 to the outside of the magnetic shielding device 440. In particular, the magnetic shielding device 440 can provide for an improved definition of a field distribution of the coil 120. Elements of the charged particle beam device outside of the magnetic shielding device 440, such as the emitter arrangement 110, are not influenced by the magnetic field generated by the coil 120. A reliable functioning of the charged particle beam device, for example, of the emitter arrangement 110, can be ensured.

In some implementations, the magnetic shielding device 440 can have an inlet opening 442 through which the primary charged particle beam 10 can enter the magnetic shielding device 440 and the coil 120 provided therein. As an example, the inlet opening 442 can be provided in front of the emitter arrangement 110, and particularly in front of the sub-beam deflector arrangement 116. The inlet opening 442 can be provided substantially symmetrically around the longitudinal axis A, which can correspond to, or be, an optical axis of the system 400.

The magnetic shielding device 440 can have an outlet opening 444 through which the primary charged particle beam 10 can exit the magnetic shielding device 440 and the coil 120 provided therein. The outlet opening 444 can be provided substantially symmetrically around the longitudinal axis A, which can correspond to, or be, an optical axis of the system 400.

According to some embodiments, the magnetic shielding device 440 is made of a single piece of material. In further embodiments, the magnetic shielding device 440 consists of two or more elements mounted together. As an example, the magnetic shielding device 440 can be made of two separate parts, such as a flange and a tube.

Figure 5A:
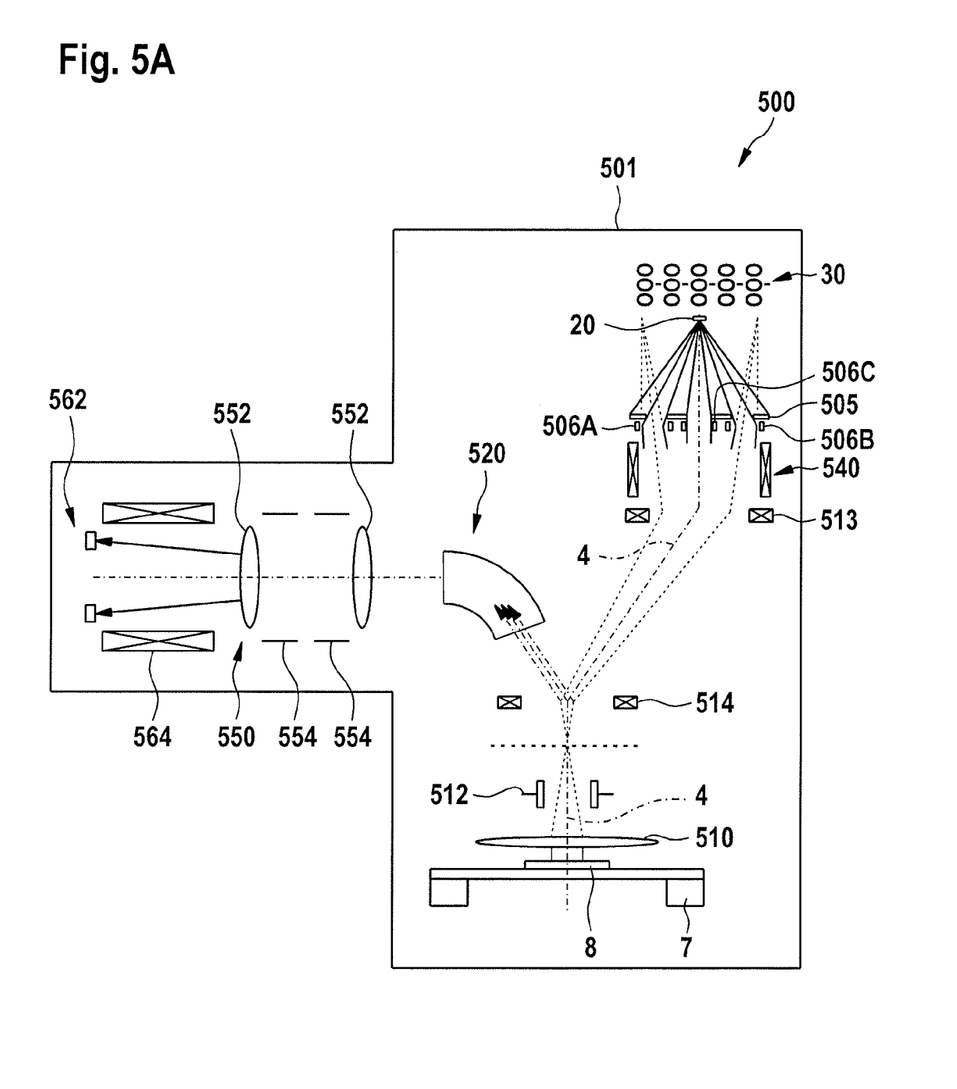
FIGS. 5A and B show schematic views of a charged particle beam device according to embodiments described herein.
Figure 5B:
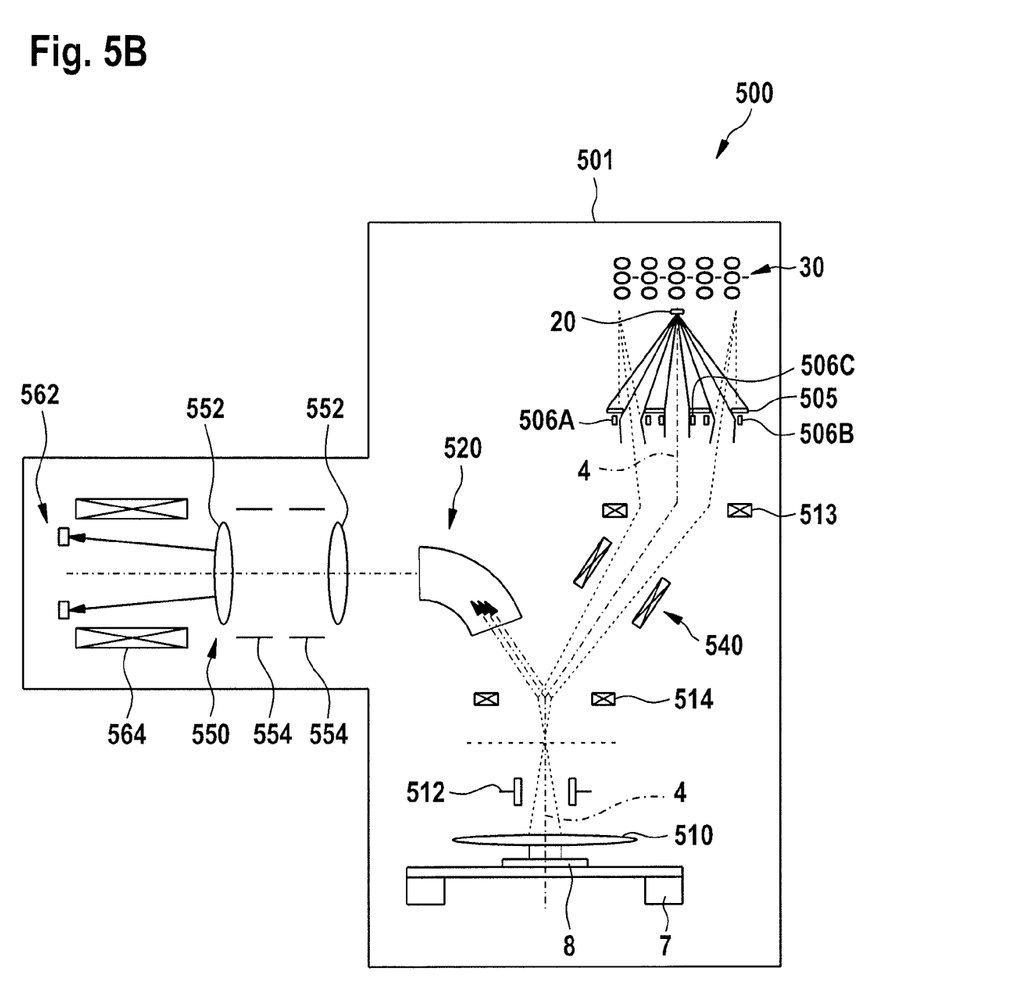

FIGS. 5A and B show schematic views of a charged particle beam device 500 according to embodiments described herein. The charged particle beam device 500 can be, for example, an electron microscope for electron beam inspection (EBI). The charged particle beam device 500 can utilize the system according to the embodiments described herein, and specifically the coil 540 for correction of the Larmor rotation. The coil 540 is only provided in the travelling path of the primary charged particle beam and not in the travelling path of the signal charged particle beam.

The charged particle beam device 500 has a column with a column housing 501 and includes an emitter arrangement configured to generate a primary charged particle beam having two or more primary charged particle sub-beams, a sample stage 7 for supporting a sample 8, an objective lens 510 for focusing the two or more primary charged particle sub-beams onto the sample 8, and a primary charged particle optics. The primary charged particle optics includes the coil 540 provided between the emitter arrangement and the objective lens 510. The coil 540 is configured to generate a magnetic field having a magnetic field component parallel to a longitudinal axis of the coil 540, wherein the magnetic field acts on the two or more primary charged particle sub-beams propagating along the longitudinal axis, and wherein an aspect ratio of the coil is at least 1. A controller is configured to adjust the magnetic field of the coil 540 such that a first primary charged particle sub-beam of the two or more primary charged particle sub-beams is directed towards a first spot on the sample 8 and a second primary charged particle sub-beam of the two or more primary charged particle sub-beams is directed towards a second spot on the sample 8, wherein the first spot and the second spot are spaced apart from each other. The coil 540 can be positioned in a drift space between the emitter arrangement and the sample stage 7.

The charged particle beam device 500 includes a beam separator 514 configured for separating the primary charged particle beam and a signal charged particle beam formed upon impact of the primary charged particle beam onto the sample 8. The primary charged particle beam impinging on the sample 8 consists of the multiple primary charged particle sub-beams spaced apart from each other. Likewise, the signal charged particle beam emanating from the sample 8 consists of the multiple signal charged particle sub-beams spaced apart from each other. The charged particle beam device 500 can further include a deflector device 513 provided between the emitter arrangement and the beam separator 514. The deflector device 513 can direct the primary charged particle beam towards the beam separator 514.

The emitter arrangement includes a primary charged particle emitter 20, for example, an electron beam source, such as a field emitter, configured to emit the primary charged particle beam. In some implementations, the primary charged particle beam passes through an aperture plate 505 of the emitter arrangement having a plurality of aperture openings in order to create the multiple primary charged particle sub-beams. The sub-beam deflector arrangement of the emitter arrangement having a plurality of deflectors 506A, 506B, and 506C can be provided to influence the primary charged particle sub-beams (beamlets) generated by the passage of the primary charged particle beam emitted from primary charged particle emitter 20 through the aperture openings.

The individual deflectors 506A-C can influence the primary charged particle sub-beams such that a plurality of virtual charged particle sources are provided. In particular, the charged particles of the primary charged particle sub-beams appear to be emitted from different locations in a plane of the primary charged particle emitter 20 perpendicular to an optical axis 4 of the charged particle beam device 500. In the example shown in FIGS. 5A and B, an array of 3×5 sources (see schematic array 30) is provided. The center source corresponds to the primary charged particle emitter 20. The other 14 sources are virtual sources with an off-set in a plane perpendicular to the optical axis 4. The beam spacing in the array 30 can be minimized such that a maximum number of beams can be created and, at the same time, the resulting multiplicity of signal charged particle sub-beams can still be kept separated from each other for registration.

Although FIGS. 5A and B illustrate the generation of multiple primary charged particle sub-beams using the emitter arrangement having the aperture plate 505, it is to be understood that the present disclosure is not limited thereto.

Other devices suitable for generation of multiple primary charged particle sub-beams for impingement on separated spots on the sample 8 can be used.

According to some embodiments, which can be combined with other embodiments described herein, charged particle beam device 500 includes the beam separator 514 configured for separating the primary charged particle sub-beams from the signal charged particle sub-beams. As an example, the beam separator 514 can include one or more deflectors, such as magnetic deflectors or a Wien Filter. The coil 540 can be positioned in a drift space between the emitter arrangement and the sample stage 7. In some implementations, the coil 540 can be positioned between the emitter arrangement and the beam separator 514. As exemplarily shown in FIG. 5A, the coil 540 can be positioned between the emitter arrangement and the deflector device 513. In the example illustrated in FIG. 5B, the coil 540 is positioned between the deflector device 513 and the beam separator 514.

The charged particle beam device 500 can include a scanning deflector arrangement having one or more scanning deflectors 512 configured to scan the two or more primary charged particle sub-beams over a surface of the sample 8. The coil 540 can be positioned between the emitter arrangement and the scanning deflector arrangement.

In some implementations, the scanning deflector arrangement can be configured to scan the two or more primary charged particle sub-beams over the sample in a first scan direction as described with respect to FIGS. 3A and B. According to some embodiments, the charged particle beam device 500 further includes an actuator configured to move the sample stage 7 in a second scan direction different from the first scan direction to scan the two or more primary charged particle sub-beams over the sample in the second scan direction.

The primary charged particle sub-beams, which appeared to be emitted from the array 30, are focused on the sample 8 using the objective lens 510. According to some embodiments, which can be combined with other embodiments described herein, the objective lens 510 can be an electrostatic magnetic compound lens, particularly having an electrostatic component that reduces the energy within the column from a high energy to a lower landing energy. As an example, the energy reduction from the column energy to the landing energy is at least a factor of 10, for example at least a factor of 30. The objective lens 510 can be a compound electrostatic-magnetic objective lens, which collects and accelerates the signal charged particle sub-beams back into the column where the signal charged particle sub-beams can be separated from the primary charged particle beam using the beam separator.

The signal charged particle sub-beams originating from the spots on the sample 8 can include particles, such as secondary electrons (SE), released and/or backscattered from the sample and may carry information about the sample 8. The information can include information about the topography of the sample 8, chemical constituents, electrostatic potential, and others. The signal charged particle sub-beams are separated from the primary charged particle sub-beams using the beam separator and enter a signal charged particle deflection device 520. The signal charged particle deflection device 520 can include, for example, a beam bender, such as a hemispherical or sector beam bender. The signal charged particle sub-beams then enter a signal charged particle detection system.

The signal charged particle detection system can include a detector arrangement 562, a coil 564, and magnification optics 550. The coil 564 can be configured similarly to the coil 540 provided in the travelling path of the primary charged particle beam. In particular, the coil 540 can be configured to generate a magnetic field for rotation correction such that the individual signal charged particle sub-beams are directed towards respective detection elements of the detector arrangement 562. The magnification optics 550 can include one or more electrostatic lenses 552 and one or more deflectors 554. The magnification optics 550 can be configured to adapt a spacing between a first signal charged particle sub-beam originating from the first spot on the sample and a second signal charged particle sub-beam originating from the second spot to the spacing between a first detection element and a second detection element of the detector arrangement 562.

Figure 6:
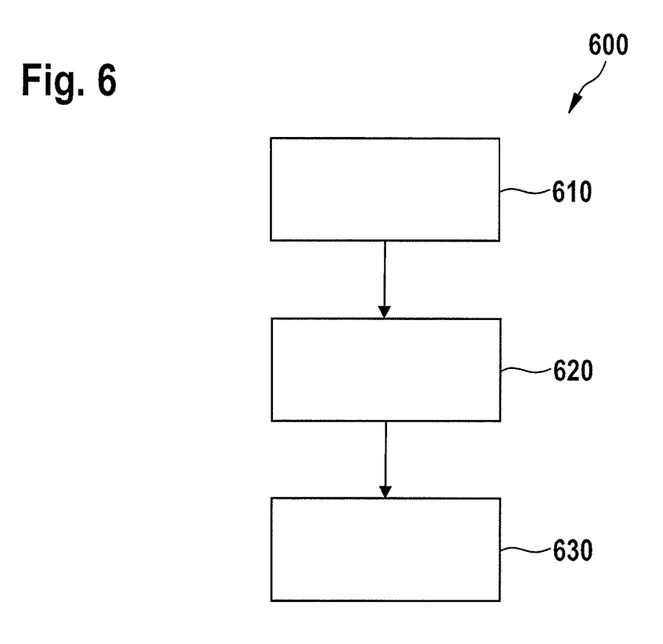
FIG. 6 shows a flowchart of a method for operating a charged particle beam device according to embodiments described herein.

FIG. 6 shows a flowchart of a method 600 for operating a charged particle beam device according to embodiments described herein. The method 600 can utilize the systems and the charged particle beam device according to the embodiments described herein.

The method 600 includes in block 610 a generation of a primary charged particle beam having two or more primary charged particle sub-beams, in block 620 a guidance of the two or more primary charged particle sub-beams through a coil having an aspect ratio of at least 1, and in block 630 a rotation of the two or more primary charged particle sub-beams with respect to a longitudinal axis of the coil using a magnetic field of the coil.

In some implementations, the method 600 can further include a directing of a first primary charged particle sub-beam of the two or more primary charged particle sub-beams onto a first spot on the sample and a second primary charged particle sub-beam of the two or more primary charged particle sub-beams onto a second spot on the sample, wherein the first spot and the second spot are spaced apart from each other.

The first spot and the second spot are separated from each other. In some implementations, a spacing between adjacent spots (e.g., a distance between centers or middle portions of the spots), such as between the first spot and the second spot can be at least 1 µm, specifically at least 10 µm, specifically at least 50 µm, and more specifically at least 100 µm. As an example, the spacing between the first spot and the second spot can be about 50 µm. According to some embodiments, adjacent spots do not overlap each other. Likewise, the primary charged particle sub-beams impinging on the sample are separated from each other. The spacing of the primary charged particle sub-beams (e.g., a distance between centers or middle portions of the sub-beams) at the sample corresponds to the spacing between the spots, such as the first spot and the second spot. In some implementations, a spacing between adjacent primary charged particle sub-beams at the sample can be at least 1 µm, specifically at least 10 µm, specifically at least 50 µm, and more specifically at least 100 µm. As an example, the spacing between adjacent primary charged particle sub-beams at the sample can be about 50 µm.

According to embodiments described herein, the method for operating a charged particle beam device can be conducted using computer programs, software, computer software products and the interrelated controllers, which can have a CPU, a memory, a user interface, and input and output devices being in communication with the corresponding components of the system for imaging a signal charged particle beam.

The present disclosure allows for a compensation of the Larmor rotation, for example, caused by the objective lens, of the array of primary charged particle sub-beams. The embodiments described herein use primary charged particle optics rather than mechanical rotation or a skewed travel of the sample stage. Rotation correction is particularly achieved by a coil, such as a long solenoid coil, having a high aspect ratio (i.e., the coil is much longer than a radius). The coil can be inserted into a drift space between an emitter arrangement defining the multi-beam array and the objective lens. By implementing the coil e.g. in the drift space, a defined amount of Larmor rotation can be introduced, wherein the original focusing properties of the primary charged particle sub-beams remain substantially unchanged. In particular, the coil only leads to a marginal additional focusing action, specifically when the rotation angles are small, e.g. below +/−30°, which does not deteriorate the original optical properties at zero coil excitation.

While the foregoing is directed to embodiments of the disclosure, other and further embodiments of the disclosure may be devised without departing from the basic scope thereof, and the scope thereof is determined by the claims that follow.

The invention claimed is:

1. A charged particle beam device, comprising:
  an emitter arrangement configured to generate a primary charged particle beam having two or more primary charged particle sub-beams;
  a sample stage for supporting a sample;
  an objective lens for focusing the two or more primary charged particle sub-beams onto the sample; and
  primary charged particle optics, comprising:
    a coil provided between the emitter arrangement and the objective lens, wherein the coil is configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1; and
    a controller configured to adjust the magnetic field of the coil such that a first primary charged particle sub-beam of the two or more primary charged particle sub-beams is directed towards a first spot on the sample and a second primary charged particle sub-beam of the two or more primary charged particle sub-beams is directed towards a second spot on the sample, wherein the first spot and the second spot are spaced apart from each other.

2. The charged particle beam device of claim 1, wherein the coil has a length L along the longitudinal axis and a radius R perpendicular to the longitudinal axis, and wherein the aspect ratio is defined as L/R.

3. The charged particle beam device of claim 1, wherein the aspect ratio is in a range between 1 and 10 or in a range between 1 and 5.

4. The charged particle beam device of claim 1, wherein the coil is configured as a rotation correction device for correction of a rotation of the two or more primary charged particle sub-beams for directing the two or more primary charged particle sub-beams onto respective predetermined spots on a sample.

5. The charged particle beam device of claim 1, wherein the coil is configured to rotate the two or more primary charged particle sub-beams around an axis in a plane perpendicular to the longitudinal axis of the coil.

6. The charged particle beam device of claim 5, wherein the coil is configured to rotate the two or more primary charged particle sub-beams by an angle in a range between +30° and −30°.

7. The charged particle beam device of claim 1, wherein the coil is positioned in a drift space between the emitter arrangement and the sample stage.

8. The charged particle beam device of claim 1, further including a scanning deflector arrangement configured to scan the two or more primary charged particle sub-beams over the sample in a first scan direction, wherein the coil is positioned between the emitter arrangement and the scanning deflector arrangement.

9. The charged particle beam device of claim 8, further including an actuator configured to move the sample stage in a second scan direction different from the first scan direction to scan the two or more primary charged particle sub-beams over the sample in the second scan direction.

10. The charged particle beam device of claim 1, further including a magnetic shielding device at least partially enclosing the coil.

11. The charged particle beam device of claim 1, wherein the emitter arrangement includes:
  a primary charged particle emitter configured to generate the primary charged particle beam;
  one or more apertures configured to generate the two or more primary charged particle sub-beams from the primary charged particle beam; and
  a sub-beam deflector arrangement configured to deflect the two or more primary charged particle sub-beams.

12. A system for a charged particle beam device, comprising:
  an emitter arrangement configured to generate a primary charged particle beam having two or more primary charged particle sub-beams;
  a coil configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1; and
  a controller configured to adjust the magnetic field of the coil to rotate the two or more primary charged particle sub-beams with respect to the longitudinal axis.

13. A method for operating a charged particle beam device, comprising:
  generating a primary charged particle beam having two or more primary charged particle sub-beams;
  guiding the two or more primary charged particle sub-beams through a coil having an aspect ratio of at least 1; and
  rotating the two or more primary charged particle sub-beams with respect to a longitudinal axis of the coil using a magnetic field of the coil.

14. The method of claim 13, further including:
  directing a first primary charged particle sub-beam of the two or more primary charged particle sub-beams onto a first spot on a sample and a second primary charged particle sub-beam of the two or more primary charged particle sub-beams onto a second spot on the sample, wherein the first spot and to second spot are spaced apart from each other.

15. The method of claim 14, wherein the method is implemented using a charged particle beam device, the charged particle beam device comprising:

an emitter arrangement configured to generate a primary charged particle beam having two or more primary charged particle sub-beams;

a sample stage for supporting a sample;

an objective lens for focusing the two or more primary charged particle sub-beams onto the sample; and primary charged particle optics, comprising:

a coil provided between the emitter arrangement and the objective lens, wherein the coil is configured to generate a magnetic field having a magnetic field component parallel to a longitudinal axis of the coil, wherein the magnetic field acts on the two or more primary charged particle sub-beams propagating along the longitudinal axis, and wherein an aspect ratio of the coil is at least 1; and a controller configured to adjust the magnetic field of the coil such that a first primary charged particle sub-beam of the two or more primary charged particle sub-beams is directed towards a first spot on the sample and a second primary charged particle sub-beam of the two or more primary charged particle sub-beams is directed towards a second spot on the sample, wherein the first spot and the second spot are spaced apart from each other.

* * * * *